United States Patent [19]

Bernard et al.

[11] 3,816,905

[45] June 18, 1974

[54] COMPLEX INTEGRATED CIRCUIT COMPRISING MOS TRANSISTORS OBTAINED BY ION IMPLANTATION

[75] Inventors: Jean Bernard, Athis-Mons; Joseph Borel, Grenoble; Philippe Glotin, La Tronche; Jacques LaCour, Grenoble, all of France

[73] Assignee: Commissariat A L'Energie Atomique, Paris, France

[22] Filed: Apr. 5, 1973

[21] Appl. No.: 348,029

Related U.S. Application Data

[63] Continuation of Ser. No. 157,323, June 28, 1971, abandoned.

[30] Foreign Application Priority Data

July 2, 1970 France .......................... 70.24545

[52] U.S. Cl. ..................... 29/571, 29/578, 29/577
[51] Int. Cl. ......................................... B01j 17/00
[58] Field of Search ..................... 29/571, 578, 577

[56] References Cited

UNITED STATES PATENTS

| | | | |
|---|---|---|---|
| 3,258,663 | 6/1966 | Weimer | 29/571 |
| 3,456,169 | 7/1969 | Klein | 29/571 |
| 3,664,893 | 5/1972 | Frazee | 29/571 |

*Primary Examiner*—W. C. Tupman
*Attorney, Agent, or Firm*—Cameron, Kerkam, Sutton, Stowell & Stowell

[57] ABSTRACT

An MOS transistor integrated circuit formed on a semiconductor substrate of a given type of conduction covered with a thin silica layer ($SiO_2$), an inert passivation layer and a metallization layer. Strips obtained by ion implantation in the substrate surface form areas for the drain and source contacts of the MOS transistors as well as connections between two points of the circuit. The metallization layer which is removed in said zones is of opposite conduction type with respect to the substrate and the metallized oxide located between two adjacent doped areas forms part of the same MOS transistor and constitutes the transistor gate. The other connections are formed by metallized strips at right angles to the strips which are created by ion implantation and located above a thick silica layer which is deposited at low temperature.

8 Claims, 11 Drawing Figures

COMPLEX INTEGRATED CIRCUIT COMPRISING MOS TRANSISTORS OBTAINED BY ION IMPLANTATION

This is a continuation, of application Ser. No. 157,323, filed June 28, 1971, now abandoned.

BACKGROUND OF THE INVENTION

This invention relates to integrated circuits comprising MOS transistors obtained by ion implantation.

MOS transistor circuits are very widely employed in electronics at the present time. The electrical characteristics of this transistor, namely its high input impedance and potential use as a variable resistor as well as the conditions of fabrication which will call for a simple technology as well as the small size of this device make this type of element very well suited for use in complex integrated circuits.

Unfortunately, MOS transistors which are obtained by means of the diffusion technique which is the most common at the present time can only be employed within very narrow frequency ranges.

SUMMARY OF THE INVENTION

A MOS transistor integrated circuit has a semiconductor substrate covered with a thin silica layer, an inert passive layer and a metallization layer. Areas are formed in the circuit for the drain and source contacts of the MOS transistors. These areas are parallel strips created by ion implantation in the surface of the substrate, the metallization layer being omitted adjacent the parellel strips and having an opposite conduction to that of the substrate, the metallized oxide between two adjacent doped areas forming a part of the same MOS transistor and the transistor gate with other connections for the circuit being metallized strips extending in a direction at right angles to that of the strips created by ion implantation and disposed above a thick silica layer.

A method for preparing an integrated circuit of this type from a silicon layer or substrate includes the following steps:

a. polishing and cleaning of the silicon plate,
b. thermal oxidation of the substrate to form a thin silicon oxide layer ($SiO_2$),
c. deposition of a chemically inert coating on the oxide layer,
d. when desired, ion implantation of a layer having higher conduction than the conduction of the substrate through the passive silica layer,
e. deposition of a metallic layer on the chemically inert layer,
f. etching openings in the metallization layer which define the areas to be doped by ion implantation (formation of the mask for obtaining the doped areas),
g. ion implantation of said areas through the mask defined under f, the inert chemical layer and the silica layer,
h. annealing the assembly consisting of the plate and of the different layers to obtain the desired characteristics of the areas which are doped by ion implantation,
i. etching of the metallic deposit on the chemically inert layer between the pairs of adjacent doped areas to determine the grid characteristics of MOS transistors which are thus constituted (formation of the grid mask), j. deposition of a thick silica layer at low temperature,
k. etching of the contact connections through the thick silica layer in the gates defined above and on the implanted areas (formation of the contact-connection mask),
l. deposition of a metallic layer (seond layer) on the thick silica layer,
m. etching of the other interconnections (formation of the last interconnection mask) of the second level.

BRIEF DESCRIPTION OF THE DRAWINGS

The diffusion technique will be explained hereinafter by means of the diagram of FIG. 1, the different figures being first set forth as follows.

DESCRIPTION OF THE PREFERRED EMBODIMENTS

Figure 1:
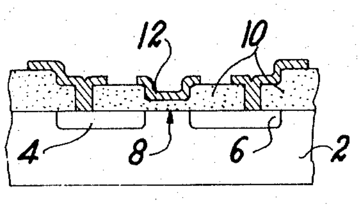
FIGS. 1 and 2 show the configurations of MOS transistors according to the prior art.

Two contacts 4 and 6 of opposite conduction type referred-to as a source and a drain are diffused into a silicon substrate 2 of N-type conduction, for example. The region 8 formed between the two contacts or so-called inversion channel is covered with a thin layer 10 of silicon oxide ($SiO_2$) on which is evaporated a metallic electrode 12 which constitutes the gate. The conductivity between the source and drain contacts is controlled by the voltage applied to said electrode 12.

As a result of the difficulties involved in positioning the metallization mask which serves as the gate and in order to have a satisfactory control of the inversion channel, a convenient expedient consists in permitting said metallization to overlap the source and drain contacts to a partial extent. This results in stray gate-source and drain-gate capacitances. The drain-gate capacitance is the main cause of degradation of frequency performances (Miller effect). The frequency limitations of the operating range are also due to the transit time of the carriers within the inversion channel as well as to the capacitance between the drain contact and the substrate.

The most recent technique of fabrication of MOS transistors by ion implantation makes it possible to improve the speed of circuits which are thus constructed and in addition to achieve a further reduction in the overall size of the circuits. The depths of diodes obtained by diffusion are greater than those obtained by ion implantation. Using ion implantation the source and drain contacts can be brought closer together. By this technique, a higher density of components per unit surface can be attained and the efficiency of the device can be improved.

Figure 2:
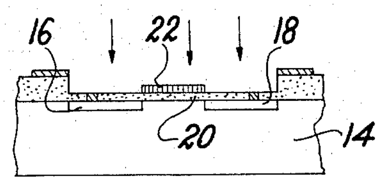

The method of ion implantation can be understood from FIG. 2. There is formed in a silicon substrate 14 of a given conduction (the N-type, for example) two areas 16 and 18 of the other type of conduction (P-type, for example) by bombardment with boron ions, for example, of said substrate through a silica layer 20 and a mask 22. The openings are formed in the mask by the photolithographic process (photoetching) in a metallic layer which is deposited on the silica. The source and drain contacts of an MOS transistor are thus formed.

That portion of the mask 22 which is located between the two contacts 16 and 18 is employed as gate electrode. Said electrode is thus accurately superimposed on the inversion channel and does not overlap the source and drain contacts as this would result in the appearance of stray capacitances. When the gate has been placed in position, it is possible to reduce the dimensions of the inversion channel and in particular the length thereof, that is, the distance between the two contacts.

The ion implantation technique makes it possible to control surface doping of the substrate. For example, doping in the channel can be modified, with the result that the value of the threshold voltage can be adjusted. Under these conditions, it is possible to employ a substrate which is doped only to a very slight extent as this serves to reduce the capacitance of the drain contact. In consequence and for these different reasons, the frequency performance of MOS transistors is improved.

The integrated circuit in accordance with the invention makes it possible by ion implantation to construct complex circuit systems comprising MOS driver and load transistors which operate in a satisfactory manner over a wide frequency range.

An MOS transistor integrated circuit in accordance with the invention which is formed on a semiconductor substrate of a given conduction covered with a thin silica layer, an inert passive layer and a metallization layer has the areas formed in said circuit for the drain and source contacts of the MOS transistors, as well as certain connections between two points of the circuit, formed by parallel strips created by ion implantation in the surface of said substrate, the metallization layer being removed at the location of said areas and being of a conduction type which is opposite to that of the substrate, the metallized oxide located between two adjacent doped areas forming part of the same MOS transistor and the transistor gate grid, the other connections of the circuit being metallized strips extending in a direction at right angles to that of the strips which are created by ion implantation and located above a thick silica layer deposited at low temperature.

This invention also relates to a method of preparation of an integrated circuit of this type from a silicon plate or substrate having a given conduction which comprises the following steps:

a. polishing and cleaning of the silicon plate,
b. thermal oxidation of the substrate to form a thin silicon oxide layer ($SiO_2$),
c. deposition of a chemically inert coating on the oxide layer,
d. when desired, ion implantation of a layer having higher conduction than the conduction of the substrate through the passive silica layer,
e. deposition of a metallic layer on the chemically inert layer,
f. etching openings in the metallization layer which define the areas to be doped by ion implantation (formation of the mask for obtaining the doped areas),
g. ion implantation of said areas through the mask defined under f, the inert chemical layer and the silica layer,
h. annealing the assembly consisting of the plate and of the different layers to obtain the desired characteristics of the areas which are doped by ion implantation,
i. etching of the metallic deposit on the chemically inert layer between the pairs of adjacent doped areas to determine the grid characteristics of MOS transistors which are thus constituted (formation of the grid mask),
j. deposition of a thick silica layer at low temperature,
k. etching of the contact connections through the thick silica layer in the gates defined above and on the implanted areas (formation of the contact-connection mask),
l. deposition of a metallic layer (second layer) on the thick silica layer,
m. etching of the other interconnections (formation of the last interconnection mask) of the second level.

Apart from the principal features described above, the invention is also related to certain secondary features which are described hereinafter and relate in particular to the preferred embodiment and to one embodiment of the method.

The complex circuits which are formed by means of this invention are preferably logic circuits in which the basic element is an inverter comprising two MOS transistors in series, namely a so-called driver transistor and a load transistor, the gate of which is brought to a direct-current potential, said load transistor performing the function of a load resistor.

The main advantage of the integrated circuits of the present invention lies in the easy implantation of a logic circuit in NOR functions when its logical equation is known. Moreover, since the implanted surfaces which form parallel strips at right angles thereto are fairly substantial, it is an advantage to reduce the capacitances between said surfaces by the thick silica layer.

Moreover, the transistors of the present invention provide fast inverters having low consumption.

In order that the present invention and its different technical advantages may be more clearly understood, an integrated circuit according to the present invention, as well as one example of the method for obtaining said integrated circuit, will be described by way of example without thereby implying any limitation in regard to the scope of the invention and the uses thereof.

Figure 3:
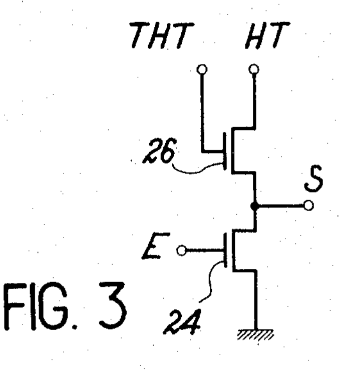
FIG. 3 is a schematic circuit diagram of an MOS transistor inverter which can serve as a basic element for the integrated circuit in accordance with the invention.

FIG. 3 is schematic circuit diagram of an inverter. The drain-source terminals of two MOS transistors 24 and 26 are connected in series and provide a connection between ground and one pole of a voltage source HT. The transistor 24 operates normally and the input voltage is applied to the gate at E, the transistor 26 performs the function of a load resistor and its gate is brought to the fixed potential of one pole of a voltage source THT. The output terminal S is connected to the common point of the two transistors.

Figure 4:
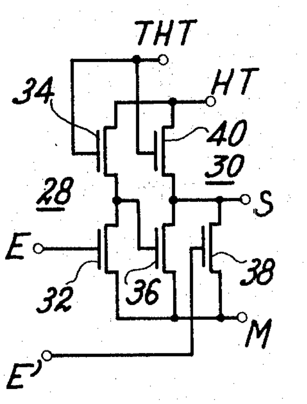
FIG. 4 is a schematic diagram of the circuit which is formed. It will be noted that this circuit employs the same NOR functions as the circuit of FIG. 3 but has two inputs.

The circuit shown in FIG. 4 consists of two inverter devices 28 and 30 in series which provide a connection between ground M and one pole of a voltage source HT. The first inverter device comprises two MOS transistors 32 and 34 and transistor 34 performs the function of a load resistor. The grounded electrodes of the MOS transistors are the "source" electrodes; the "drain" electrodes are connected to the terminal HT. The gate of the transistor 34 is brought to the fixed potential of one pole of a voltage source THT. An input voltage E is applied to the gate of the transistor 32. The second inverter 30 was two MOS active transistors 36 and 38 in parallel and an MOS load transistor 40. The gate of said load transistor is brought to the fixed potential of the pole of a voltage source THT. The gate of the transistor 36 is connected to the common point of the two transistors of the first inverter 28. The gate of the transistor 38 is connected to a second input terminal E'. The output terminal S of the circuit is connected to the common point of the transistors 36, 38 and 40.

Figure 5:
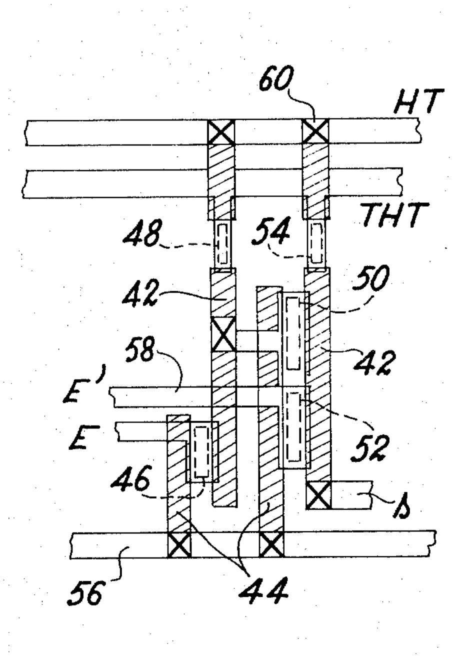
FIG. 5 represents the topology of the circuit which is constructed in accordance with the invention and electrical diagram of which is as shown in FIG. 4.

FIG. 5 shows the topology of an integrated circuit of the present invention as shown in the schematic circuit diagram of FIG. 4. The essential feature is the use of the doped areas (shown in diagonal hatchings in FIG. 5) as vertical connections and the use of horizontal metallized portions in order to form the circuit. The contact points are represented by crosses.

The method of making MOS driver and load transistors is the same. In FIG. 5, the doped areas are located in each side of the inversion channels 48 and 54 in the direction of the width of said channels and on each side of the channels 46, 50 and 52 in the direction of the length of said channels. The reason for this is that the load transistors, which perform the function of load resistor, must have an inversion channel disposed lengthwise.

The interconnections between the elements are formed by utilizing two levels, a level of implanted areas and an upper metallization layer and may include an intermediate level. The vertical doped strips 42, 44 are created by ion implantation into a silicon substrate covered with a passive thin silica layer through a mask (not shown) which is formed by chemical etching (photo-lithography) of a continuous metallization layer. Said strips 42 and 44 are in adjacent relation to the regions 46, 48, 50, 52 and 54 of the initial metallization layer which corresponds respectively to the inversion channels of the transistors 32, 34, 36, 38 and 40 (as shown in FIG. 4). It should be noted that the portions which are adjacent to the regions referred to above are the source and drain zones. The gate electrodes of said transistors are the portions of the metallized layer which covers the inversion channels.

The circuit is completed by parallel metallized strips which are at right angles to the doped strips (horizontal metallized strips in FIG. 5). The metallized strips are connected to the doped strips and to the gate electrodes of the transistors. However, in order to reduce the capacitance between the doped and metallized strips, these two types of strips are separated by a thick silica layer. The thick silica layer is first formed by deposition followed by photoetching thereof down to the doped strips and gate electrodes which are to be interconnected. There is then formed a continuous metallization layer in which the metallic strips 56, 58, constituting a second metallization layer (shown in FIG. 9), are defined by photoetching.

There will now be described an embodiment of the method of the present invention as illustrated in FIGS. 6 to 9.

Figure 6:
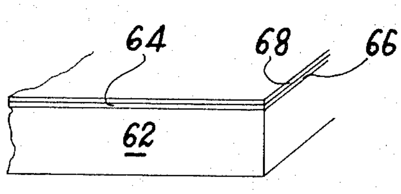
FIGS. 6 to 9 represent different stages of application of the method according to the invention.
Figure 7:
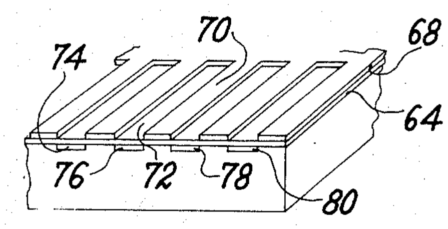

A silicon substrate 62 of N-type conduction, for example (as shown in FIG. 6), is first polished and cleaned by any known means. In accordance with a technique which is also conventional, the substrate is subjected to thermal oxidation in order that the substrate be covered with a thin layer 64 of silica ($SiO_2$) having a thickness of approximately 1,000 A. Said layer is then subjected to a passivation treatment. A thin layer 66 of silicon nitride ($Si_3N_4$) is then deposited. The performances of the circuit thus formed can be improved by reduction of stray capacitances and this is achieved by carrying out an ion implantation operation to form a layer N ÷ /N. The substrate which is covered with a layer of passive silica is then metallized using, for example, aluminum which forms a layer 68. It will be seen later that it may be highly advantageous to use polycristalline silicon in place of aluminum.

A first mask which defines the areas to be implanted to form parallel strips (vertical strips in FIG. 7) is then etched in the metal layer by the photoetching technique. All that is then left of the metallic deposit 68 is a mask 70 (shown in FIG. 7) which defines the parallel strips 72 to be doped. The ion implantation operation is then carried out through the mask hereinabove described, the passive layer and the silica layer. The source and drain junctions which are thus formed are therefore passive. The plate assembly in which the doped areas 74, 76, 78 and 80 are formed is subjected to an annealing operation to adjust the electrical characteristics of said areas.

Figure 8A:
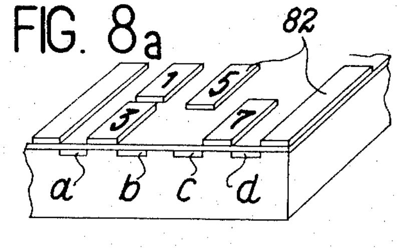
Figure 8B:
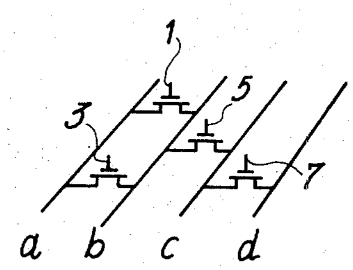

Part of the metallic coating which covers the oxide layer located between two areas which have been doped by ion implantation is employed as a control gate in order to obtain the MOS effect between said two areas. The remaining metallic deposit is etched to define geometrically the grid electrodes 1, 3, 5, 7, which are shown in FIG. 8*a*, and the inversion channels of the transistors. A schematic circuit diagram, which is equivalent to the device of FIG. 8*a* is shown in FIG. 8*b*. It should be noted that, starting with two successive implanted areas, it is possible to define a number of MOS transistors having separate control and connected in parallel. The thick layer of $SiO_2$ 88 in FIG. 9 is deposited at low temperature and the contact connections are etched in the above-defined gates and in the implanted strips.

Figure 9:
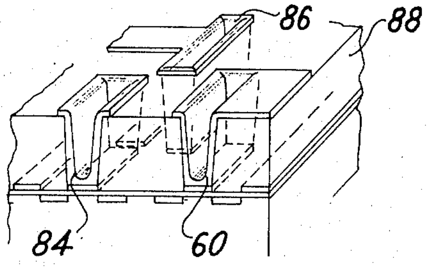

General metallization of the plate (second level) is carried out and the desired circuit is formed after etching of the interconnections (references 60, 84, 86 in FIG. 9).

Another embodiment of the method of the present invention reduces the threshold voltage of the MOS transistors to approximately 0.6 volt. This remarkable result is obtained using polycristalline silicon instead of aluminum as previously employed to form the gates. The metallic layer described above under *e* in the second paragraph of the introductory description of the present method is in this case a layer of polycrystalline silicon. In this embodiment, the mask is a polycrystalline silicon deposit.

Figure 10:
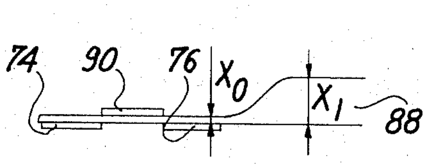

In FIG. 10, which shows in cross-section one embodiment of an MOS transistor in accordance with the other embodiment of the method using polycrystalline silicon, $x_0$ and $x_1$ designate, respectively, the thicknesses of the thin and thick oxide layers. With a predetermined ratio $x_1 / x_0$, the use of polycrystalline silicon, designated by reference numeral 90, increases the ratio of maximum supply and threshold voltages. IN fact, using polycrystalline silicon, reduces the threshold voltage while the maximum supply voltage is unchanged. This results in an improvement in the frequency performances of the circuit as a result of an area of greater linearity of the load resistance and a reduction in drift of the threshold voltage. These improvements of the circuit are advantageous particularly when the circuit is employed with a TTL logic circuit.

It is worthy of note that the deposition of a thick silica layer does not modify the positions of the substrate-source and substrate-drain junctions. As has already been explained, the stray capacitances associated with such node and the dangers of parasitic channels are negligible because of the thickness of deposited oxide.

In accordance with this invention, the number of masks employed (four) is the same as in conventional diffusion technology but much greater flexibility in use is obtained.

The circuits of the present invention have smaller dimensions than those of the prior art since a metallization strip may pass above a gate or implanted strip without establishing a contact. Elimination of lateral diffusion of the source and drain contacts results in reduction in size of these contacts and consequently in reduction of the total area occupied by a transistor.

The method of the present invention offers considerable flexibility in the interconnection of elements by using two levels, namely, a level of implanted areas and an upper metallization level, and, if necessary, an intermediate level. This last-mentioned feature is particularly applicable to computerized fabrication of complex circuits.

The performances of a circuit of this type are improved with respect to the performance of a circuit of known type reduction in stray feedback capacitances and in nodal capacitances and by reduction in the length of connections and the length of channels.

What we claim is:

1. Process for obtaining integrated circuits including a plurality of transistors of metal oxide semi-conductor type, the steps of depositing on a semi-conductor substrate having a given type of conduction, a first uniform layer of silica ($SiO_2$), then forming on said silica layer a first uniform metallization layer, removing a part of said metallization layer in parallel areas, said areas of removed metallization corresponding to the drain and source of the transistors and to connections between said transistors, doping by ion implantation with impurities giving a conductivity of the type opposite to that of the conductivity of said substrate the areas where the layer of metallization has been removed, removing a part of the metallization layer leaving metallization only in the areas corresponding to the gates of the transistors, forming a thick layer of silica on the substrate assembly, forming openings through said thick silica layer corresponding to the location of the gates of the transistors, forming other openings through the two layers of silica corresponding to certain areas of the doped zones, forming a second metallic deposit on the thick layer of silica and in said openings and removing part of said last metallic deposit forming bands perpendicular to the doped zones only in the regions where connections are made between said openings.

2. Process as described in claim 1 including the step, before partial removal of the first metallization layer, of modifying the initial conductivity of the substrate is modified by ion implantation through the first silica layer.

3. Process as described in claim 1 including the step of thermally oxidizing the substrate to obtain the first silica layer.

4. Process as described in claim 1 including the step of providing an inert uniform passivation layer between the first silica layer and the first metallization layer.

5. Process as described in claim 4, the inert passivation layer being obtained by depositing a thin layer of $Si_3N_4$ on the first silica layer.

6. Process as described in claim 1, the first metallization layer being an aluminum deposit.

7. Process as described in claim 1, the first metallization layer being a polycrystalline silica deposit.

8. Process as described in claim 1, the successive removals of the first metallization layer being by photoengraving.

* * * * *